United States Patent
Ayub (10) Patent No.: US 11,555,943 B2
(45) Date of Patent: Jan. 17, 2023

(54) METHOD FOR IDENTIFYING MISALLOCATED HISTORICAL PRODUCTION DATA USING MACHINE LEARNING TO IMPROVE A PREDICTIVE ABILITY OF A RESERVOIR SIMULATION

(71) Applicant: Saudi Arabian Oil Company, Dhahran (SA)

(72) Inventor: Jibran Ayub, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 400 days.

(21) Appl. No.: 16/825,716

(22) Filed: Mar. 20, 2020

(65) Prior Publication Data
US 2021/0293992 A1   Sep. 23, 2021

(51) Int. Cl.
*G01V 99/00*   (2009.01)
*G06F 30/27*   (2020.01)
(Continued)

(52) U.S. Cl.
CPC .......... *G01V 99/005* (2013.01); *G06F 30/27* (2020.01); *G06K 9/6256* (2013.01); *G06N 3/084* (2013.01); *G06N 3/10* (2013.01); *G06N 7/005* (2013.01)

(58) Field of Classification Search
CPC ....... G06F 30/00; G06F 30/27; G06K 9/6256; G06N 3/084; G06N 3/10; G06N 7/005;
(Continued)

(56) References Cited

U.S. PATENT DOCUMENTS

| 5,212,765 A | 5/1993 | Skeirik |
| 5,408,586 A | 4/1995 | Skeirik |

(Continued)

FOREIGN PATENT DOCUMENTS

| CN | 103177155 A | * | 6/2013 |
| CN | 103177155 A | | 6/2013 |

(Continued)

OTHER PUBLICATIONS

Ramgulam, Asha et al., "Utilization of Artificial Neural Networks in the Optimization of History Matching", Apr. 2007, SPE Latin American and Caribbean Petroleum Engineering Conference, Society of Petroleum Engineers. (Year: 2007).*

(Continued)

*Primary Examiner* — Cedric Johnson
(74) *Attorney, Agent, or Firm* — Leason Ellis LLP (57) ABSTRACT

A method for training a predictive reservoir simulation in which high-confidence reservoir sample data is used to identify misallocated historical production data used in the simulation. A neural network algorithm is trained with high-confidence reservoir historical production data. High-confidence reservoir sample data is obtained by at least one sensor at a reservoir location over a time interval, after which the reservoir historical production data is parametrically varied over the time interval to determine a time-indexed discrepancy between the reservoir historical production data and the high-confidence reservoir sample data over the time interval. The time-indexed discrepancy and a defined threshold discrepancy are then used as inputs to a machine learning process to further train the neural network algorithm to identify reservoir historical production data whose discrepancy exceeds the threshold discrepancy and thereby constitutes misallocated historical production data.

(Continued)

The misallocated data is later back allocated to respective wells by back propagation algorithm.

12 Claims, 9 Drawing Sheets

(51) Int. Cl.
*G06K 9/62* (2022.01)
*G06N 3/08* (2006.01)
*G06N 3/10* (2006.01)
*G06N 7/00* (2006.01)

(58) Field of Classification Search
CPC .............. G06N 3/0427; E21B 2200/20; E21B 2200/22
USPC ...................................................... 703/10, 6
See application file for complete search history.

(56) References Cited

U.S. PATENT DOCUMENTS

| | | | |
|---|---|---|---|
| 5,640,493 A | 6/1997 | Skeirik | |
| 5,826,249 A | 10/1998 | Skeirik | |
| 6,823,296 B2 | 11/2004 | Rey-Fabret et al. | |
| 7,966,273 B2 | 6/2011 | Hegeman et al. | |
| 9,187,984 B2 | 11/2015 | Usadi et al. | |
| 9,747,393 B2 | 8/2017 | Dasari | |
| 10,055,684 B2 | 8/2018 | Fleming et al. | |
| 10,087,721 B2 | 10/2018 | Usadi et al. | |
| 10,198,535 B2 | 2/2019 | Usadi et al. | |
| 10,223,482 B2 | 3/2019 | Borrel et al. | |
| 2013/0096899 A1 | 4/2013 | Usadi et al. | |
| 2017/0364795 A1 | 12/2017 | Anderson et al. | |
| 2018/0202264 A1 | 7/2018 | Sarduy et al. | |

FOREIGN PATENT DOCUMENTS

| | | | |
|---|---|---|---|
| CN | 103198354 A | * | 7/2013 |
| CN | 103198354 A | | 7/2013 |
| CN | 104234695 A | | 11/2014 |
| CN | 104732303 A | | 6/2015 |
| CN | 105096007 A | | 11/2015 |
| CN | 108730776 A | | 11/2018 |
| KR | 101706245 B1 | * | 2/2017 |
| KR | 101706245 B1 | | 2/2017 |
| RU | 2598785 C2 | | 5/2016 |
| RU | 2602779 C2 | | 11/2016 |
| WO | 2017117445 A1 | | 7/2017 |
| WO | 2019144066 A1 | | 7/2019 |

OTHER PUBLICATIONS

Al-Fattah, S.M., et al., "Predicting Natural Gas Production Using Artificial Neural Network", Apr. 2-3, 2001, SPE Hydrocarbon Economics and Evaluation Symposium, Society of Petroleum Engineers, Inc. (Year: 2001).*
Korovin Iakov et al: Application of hybrid data mining methods to increase profitability of heavy oil production11, 2016 5th International Conference on Informatics, Electronics and Vision (ICIEV), IEEE, May 13, 2016 (May 13, 2016), pp. 1149-1152, XP033012693, DOI: 10.1109/ICIEV.2016.7760179 [retrieved on Nov. 28, 2016].
ISR and Written Opinion, PCT/US2021/022958; dated Jul. 7, 2021.

* cited by examiner

METHOD FOR IDENTIFYING MISALLOCATED HISTORICAL PRODUCTION DATA USING MACHINE LEARNING TO IMPROVE A PREDICTIVE ABILITY OF A RESERVOIR SIMULATION

FIELD OF THE DISCLOSURE

This patent application relates to methods for improving a predictive ability of a reservoir simulation, and particularly to the identification of misallocated historical production data that adversely affects the predictive ability of a reservoir simulation.

BACKGROUND OF THE DISCLOSURE

Reservoirs are complex geological features whose thermofluidic properties are governed by myriad interacting physical phenomena, which can be described by the governing differential equations for conservation of mass (continuity), conservation of momentum (Navier-Stokes equations), and conservation of energy. As reservoirs such as petroleum reservoirs are natural phenomena, it is usually difficult to develop closed-form, analytical solutions for the entire flow field merely by applying the classical conservation equations (i.e., mass, momentum, and energy) of fluid mechanics. For example, a complete flow field solution to the Navier-Stokes equation for momentum in a fluid flow is often only analytically possible for a very simple, axisymmetric flow field geometry. The flow field over an entire petroleum reservoir, on the other hand, is an exceedingly complex multivariate problem replete with asymmetric, irregular geometries and flow variable interdependencies that defy solution using analytical methods.

The analytical intractability of the problem has spurred the development of certain analytical tools that are best implemented on digital computers. Computational fluid dynamics (CFD) software packages are one type of tool that finds widespread use in determining the thermofluidic properties of complex flow systems. A CFD software package or application program encodes the governing differential equations into a digital computer simulation that, when supplied with input including initial and boundary conditions, can determine fluid velocities, pressures, and heat transfer rates at locations throughout the flow field. Data to provide valid initial and boundary conditions can be supplied by downhole sensors such as production logging tools. As a reservoir builds a production history, the data collected across the full complement of sensors distributed therein will serve to validate the CFD simulation as well as provide guidance to customize the simulation to local conditions.

While being a powerful analytical tool, computational fluid dynamics software still has limitations when applied to petroleum reservoirs. CFD is most ideally suited to the computational solution of channel flows (i.e., pipes) and free-stream flows about bodies that display at least some degree of symmetry, e.g., aircraft and missiles. Petroleum reservoirs not only involve fluid flows about and within more arbitrary, natural shapes, but they also add complex geological considerations such as the porosity of the reservoir medium in which the petroleum to be extracted resides. The differential equations encoded into a standard CFD software package are not sufficient to account for the multitude of complex variables that come into play as a petroleum reservoir is subjected to an extraction operation over time.

It is with respect to this background that the present disclosure is addressed.

SUMMARY OF THE DISCLOSURE

The present disclosure provides a method and system that can be used to identify misallocated historical production data present in a training set of data that has been used to train a neural network algorithm, thereby enabling corrections of the inputs to a reservoir simulation model to be made.

According to a method consistent with the present disclosure, a computer-based method is provided whereby a neural network model is trained using high-confidence reservoir historical production data and high-confidence geological data, PVT saturation logs, portable tests, and other measurements to identify misallocated historical production data and thereby improve a predictive ability of the reservoir simulation. According to this method, a neural network algorithm is trained with a reservoir training set to produce correlations that enable the reservoir simulation to make predictions of reservoir performance, wherein the reservoir training set comprises reservoir physical conditions corresponding to reservoir historical production data obtained during operation of the reservoir. The method then uses at least one portable sensor or at least one sensor at a reservoir location to obtain high-confidence reservoir sample data over a time interval, for use in comparison to the reservoir historical production data in training the algorithm to recognize outlier or misallocated historical production data. Next, the method involves parametrically varying the reservoir historical production data over the time interval to determine a time-indexed discrepancy between the reservoir historical production data and the high-confidence reservoir sample data which has been measured over the time interval. In turn, the time-indexed discrepancy is used in conjunction with a defined threshold discrepancy as inputs to a machine learning process to further train the neural network algorithm to identify misallocated historical production data, which is defined as reservoir historical production data whose discrepancy exceeds the threshold discrepancy. Having identified any misallocated historical production data that may be present in the reservoir simulation, it can then be replaced in the reservoir simulation training set with the high-confidence reservoir sample data to produce a revised training set.

In certain implementations, the method involves retraining the neural network algorithm to produce correlations using the revised training set as input to the neural network algorithm.

In certain implementations, the step of retraining the neural network algorithm with the revised training set can be repeated, producing revised correlations in support of improved predictions of reservoir performance by the reservoir simulation. This allows new training runs to be made with the reservoir simulation that further increase the accuracy of its predictions.

In certain implementations, the machine learning process whereby the neural network algorithm is trained to identify misallocated historical production data comprises a neural network algorithm.

According to another method consistent with the present disclosure, a computer-based method is provided for training a reservoir simulation using reservoir historical production data and high-confidence reservoir sample data to identify and replace misallocated historical production data with high-confidence reservoir sample data, thereby improving a predictive ability of the reservoir simulation. High-confidence reservoir historical production data is obtained over an interval of time from a plurality of sensors distributed throughout the reservoir and used as a training set to train a neural network algorithm to function as a reservoir simulation capable of predicting values for reservoir production data. High-confidence reservoir sample data is then obtained using at least one portable sensor or at least one of the plurality of sensors distributed throughout the reservoir. A backpropagation algorithm is used to compare the reservoir historical production data to high-confidence reservoir sample data at corresponding position and time points, and a revised training set is compiled by replacing instances of reservoir historical production data with high-confidence reservoir sample data at corresponding position and time points at which differences between the two datasets, indicating misallocated historical production data, have been identified by the comparison. The revised training set can then be used to retrain the neural network algorithm to improve the predictive ability of the reservoir simulation.

The present disclosure also provides a computer-based system that can be used to train a reservoir simulation based upon reservoir historical production data to identify misallocated historical production data to improve a predictive ability of the reservoir simulation. The system includes at least one processor connected to at least one memory, and a reservoir simulation running on the at least one processor. The reservoir simulation incorporates a neural network algorithm trained with a reservoir training set to generate correlations that enable the reservoir simulation to make predictions of reservoir performance. The reservoir training set includes data related to reservoir physical conditions that reflect reservoir historical production data obtained previously by sensors in the reservoir during operations. The system includes at least one portable sensor or at least one sensor at a reservoir location to provide high-confidence reservoir sample data over a time interval, which is to be used to check the quality of the previously-obtained reservoir historical production data. Sometimes new measuring techniques or equipment, once installed provides more accurate, high-confidence data measurements. This newly acquired data will have high accuracy and the interval over which the new data is collected can be used to train the model. By training the model with accurate data, the system, through its machine learning, can discern the previous data as being erroneous by virtue of it not fitting in the operational window of the model.

As such, an expert system is also part of the disclosed system and runs on the at least one processor. The expert system is configured to parametrically vary the reservoir historical production data over the time interval to determine a time-indexed discrepancy between the reservoir historical production data and the high-confidence reservoir sample data which has been sensed over the time interval, as discrepancies of a certain size tend to be more indicative of misallocated or "outlier" data than they are an indication of mere measurement uncertainty. A machine learning process also runs on the at least one processor, and the machine learning process takes the time-indexed discrepancy determined by the expert system and a defined threshold discrepancy as inputs to further train the neural network algorithm to identify misallocated historical production data, which is defined as data whose discrepancy exceeds the threshold discrepancy. The machine learning process is also configured to replace instances of identified misallocated historical production data in the reservoir simulation training set with the high-confidence reservoir sample data to produce a revised training set.

In one implementation consistent with the present disclosure, the neural network algorithm is configured to be retrained using the revised training set as input, resulting in the generation of correlations by the neural network algorithm.

In another implementation consistent with the present disclosure, the retraining of the neural network algorithm can be repeated with the revised training set, producing revised correlations in support of improved predictions of reservoir performance by the reservoir simulation.

In a further aspect that may be included in implementations of the system, the machine learning process used to determine the time-indexed discrepancy comprises a neural network algorithm.

According to another system consistent with the present disclosure, a computer-based system is provided wherein a reservoir simulation is trained using high-confidence reservoir historical production data and high-confidence reservoir sample data to identify misallocated historical production data and replace misallocated historical production data with high-confidence reservoir sample data, thereby improving a predictive ability of the reservoir simulation. A plurality of sensors is distributed throughout the reservoir to obtain high-confidence reservoir historical production data over an interval of time. A system comprising at least one processor connected to at least one memory has a reservoir simulation running on the at least one processor. The reservoir simulation comprises a neural network algorithm trained with a reservoir training set comprising the high-confidence reservoir historical production data to enable the neural network algorithm to function as a reservoir simulation capable of predicting values for reservoir production data. The neural network algorithm further comprises a backpropagation algorithm which is configured to compare the reservoir historical production data to high-confidence reservoir sample data at corresponding position and time points, wherein the high-confidence reservoir sample data has been obtained using at least one portable sensor or at least one of the plurality of sensors distributed throughout the reservoir. The backpropagation algorithm compiles a revised training set by replacing instances of reservoir historical production data with high-confidence reservoir sample data at corresponding position and time points at which differences between the two datasets, indicating misallocated historical production data, have been identified by the comparison. The algorithm is trained with an operational window for each well based on reservoir properties, facility constraints and its production potential limits. The backpropagation algorithm then retrains the neural network algorithm using the revised reservoir training set to improve the predictive ability of the reservoir simulation. The training can be accomplished utilizing a neural network algorithm, examples of which include convolutional neural networks (CNN) or K-Nearest Neighbors Networks (KNN).

In certain implementations according to any of the foregoing systems and methods, the reservoir historical production data and the high-confidence reservoir sample data can include, without limitation, observed production data, well logs, saturation logs, permeability logs, porosity logs, the product of formation permeability k and producing formation thickness h (kh), reservoir contact length, well spacing, choke opening, well location, well depth, well test data, well trajectories, well workover data, buildup test data, production logging tool data, repeat formation tester (RFT) data, pressure-volume-temperature (PVT) data, gas/oil ratio (GOR) data, core data, special core analysis laboratory (SCAL) data, gas oil separation plant (GOSP) level, well level, well rate tests, separator tests, portable tests, and productivity/injectivity index. These measurements are used in conjunction with known reservoir geology parameters to train a well performance model that defines an operational window for the well, bounded by maximum and minimum performance limits.

For example, the fact that the reservoir rock possesses virtually no elasticity will cause any attempt to produce at higher rate to result in a high pressure drop. Measurement instrumentation distributed throughout the reservoir will measure the pressure changes and corresponding production rates, which are then correlated with the geology of the "tight" reservoir rock. Any wells that are close in proximity to the subject well will exhibit similar behavior, and this fact is also used in training the model.

As a further example, a production rate cannot be pushed higher when operating the well at the maximum draw down pressure, and these conditions will define the upper limit of the well's production rate. If the algorithm subsequently encounters a data value which falls outside of the limits defined in the model, the data is identified as misallocated and sent to a pool of misallocated data for subsequent reallocation by the algorithm to the appropriate well.

The time intervals used for the measurements which will be used to update the algorithm are preferably periods during which high-precision sensors were in place to obtain the measurements. Data provided by these high-precision sensors, wherein there is 95% confidence or better that the measurements are accurate, are called "high-confidence" data. Put another way, "high-confidence" data refers to measurements from the field wherein the actual conditions under which the measurement was taken, such as the actual pressure and temperature conditions as well as the precise location of the measurement, are known. During the service life of a given wells, operators will often have compiled records covering multiple periods over which the measurements are regarded as accurate or "high-confidence" data. This repository of "high-confidence" data defines the operational window of these wells and can be used to further train the model to make determinations of misallocated data.

These and other features, aspects, and advantages can be appreciated from the following description of certain embodiments in accordance with the present disclosure.

BRIEF DESCRIPTION OF THE DRAWINGS

The accompanying drawing figures illustrate exemplary embodiments and are not intended to be limiting of the present disclosure. Among the drawing figures, like references are intended to refer to like or corresponding parts.

DETAILED DESCRIPTION OF CERTAIN EMBODIMENTS ACCORDING TO THE DISCLOSURE

The present disclosure concerns a method and system that can be used to identify misallocated historical production data present in a training set of data that has been used to train a neural network algorithm to form a reservoir simulation.

Figure 1:
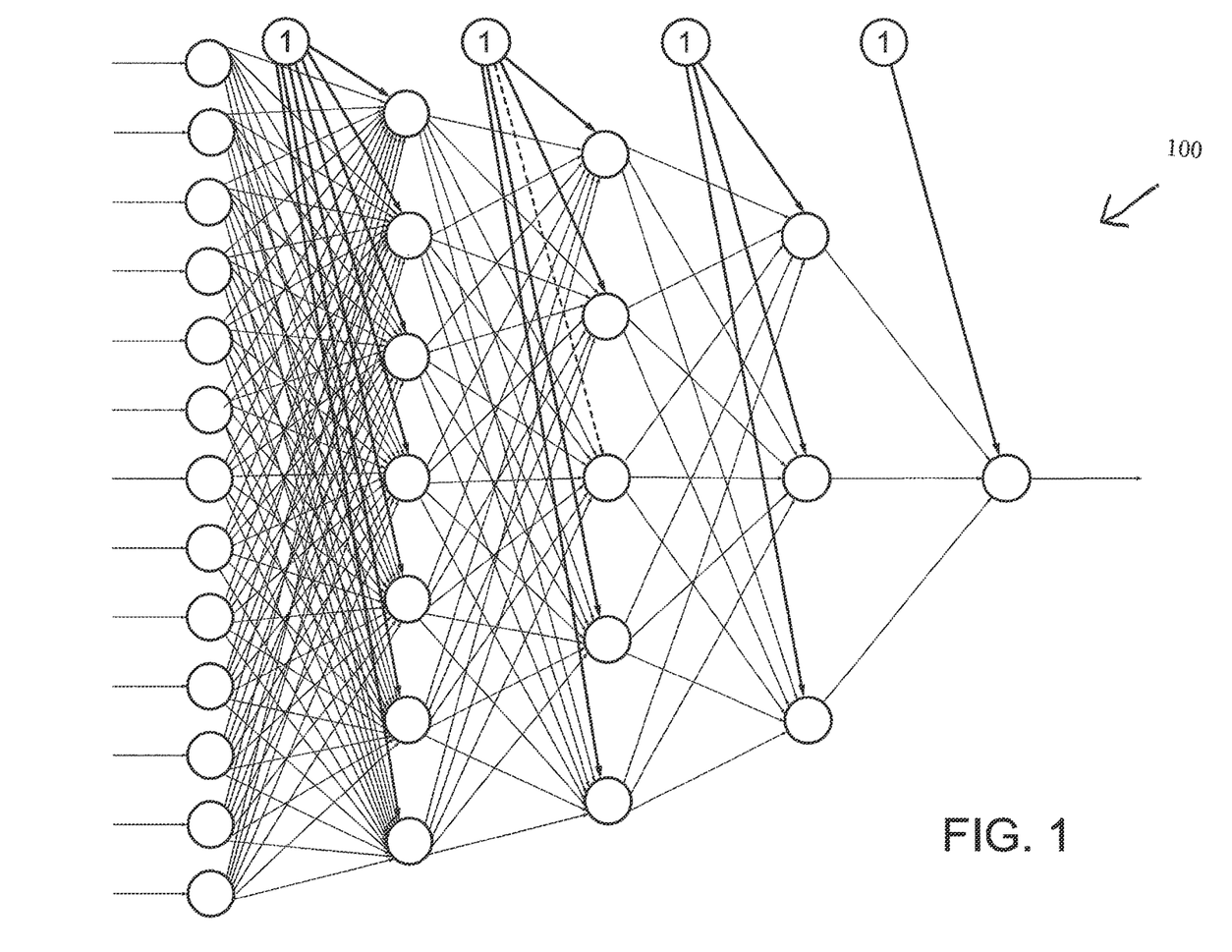
FIG. 1 illustrates a schematic view of one exemplary neural network used by the reservoir simulation of the present disclosure.
Figure 2A:
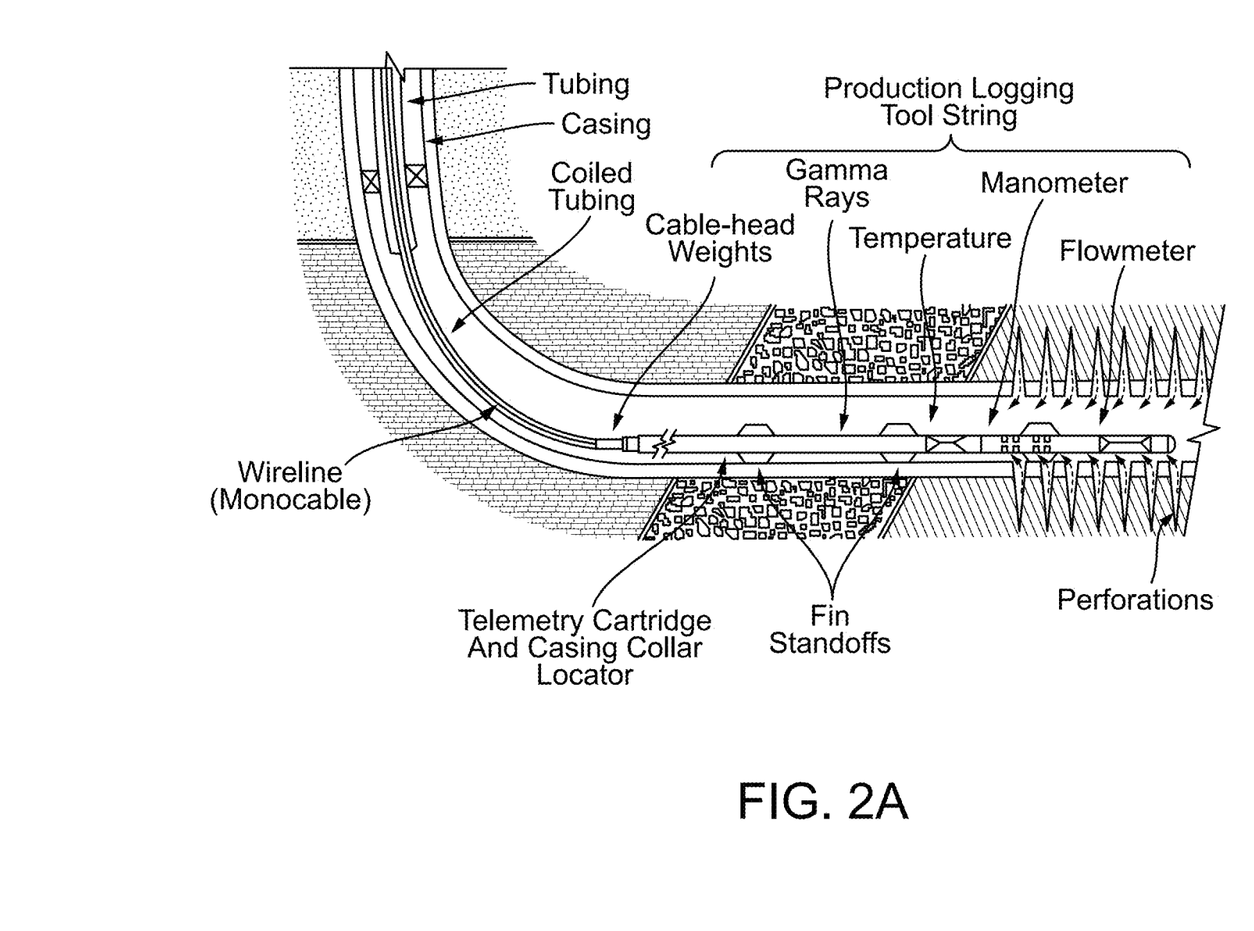
FIG. 2A illustrates an exemplary production logging tool that is used to obtain reservoir historical production data related to reservoir operation.
Figure 2B:
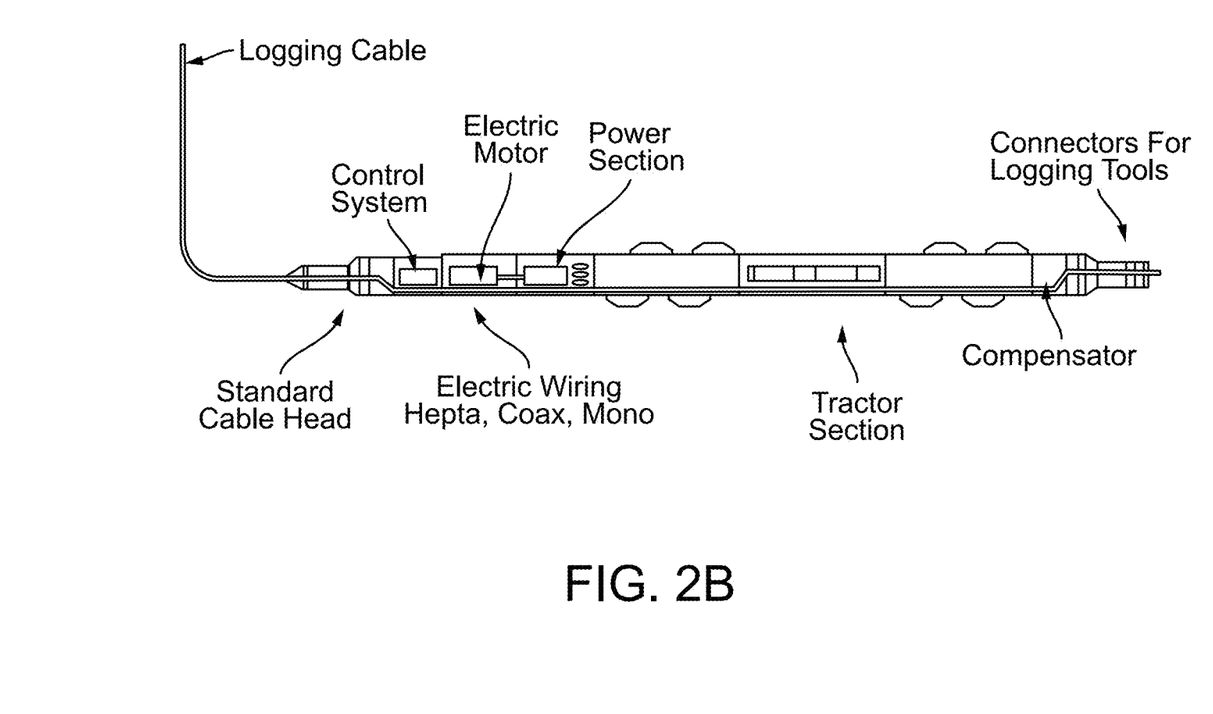
FIG. 2B illustrates an exemplary downhole well tractor tool that is used to deploy a production logging tool.

Given the intractable nature of the analytical problem using only the governing equations of fluid mechanics, the solution to the problem of analyzing the flow field has been to gather copious amounts of historical production data and present it to an artificial neural network (ANN). An exemplary neural network 100 comprised of multiple layers of neurons is shown in FIG. 1. The successive layers of neurons that make up the ANN will establish correlations between the various data that are presented to it as inputs (such as geologic features (geology), separate tests, lab test, logs, reservoir properties, production rates, bottom hole pressures, PVT, GOR, and so on), effectively providing the mathematical solution to the flow field that eludes analytical solution methods and which provides an oil-well performance model. The types of reservoir data that can be presented to the ANN to determine the correlations that constitute the flow field solution include flow rates and flow field parameters such as pressure, volume, and temperature (PVT). The data are obtained from a multitude of conventional sensors which are employed to monitor and/or draw production from the wellheads disposed throughout the reservoir. Among other typical sensors are production logging tools (PLT). Production logging tools are typically modular sensors that are used downhole to provide accurate measurements of pressure-volume-temperature (PVT), flow rates, flow velocity, gas hold up, porosity and permeability, and other auxiliary measurements. The flow velocity measurement technologies used by these PLTs include continuous flow meters, basket flow meters, full-bore flow meters and inline flow meters. A standard PLT will also include technologies for fluid identification and flow composition measurement to obtain parameters such as gas holdup, capacitance water holdup, radioactive fluid density, and differential pressure density. FIG. 2A shows one embodiment of an exemplary, conventional PLT with its variety of flow measurement instrumentation. FIG. 2B shows an embodiment of a conventional downhole well tractor tool that can be used to deploy a production logging tool. The instrumentation to measure reservoir properties can also include a multitude of other types of mechanical or electronic downhole sensors to measure the set of well properties including pressure, temperature, fluid flow rate through each branch of a multilateral well, as well as operational conditions such as vibration, composition, fluid flow regime, and fluid holdup. The downhole sensors are typically operated effectively as permanent fixtures, left in place for months or even years.

Figure 3:
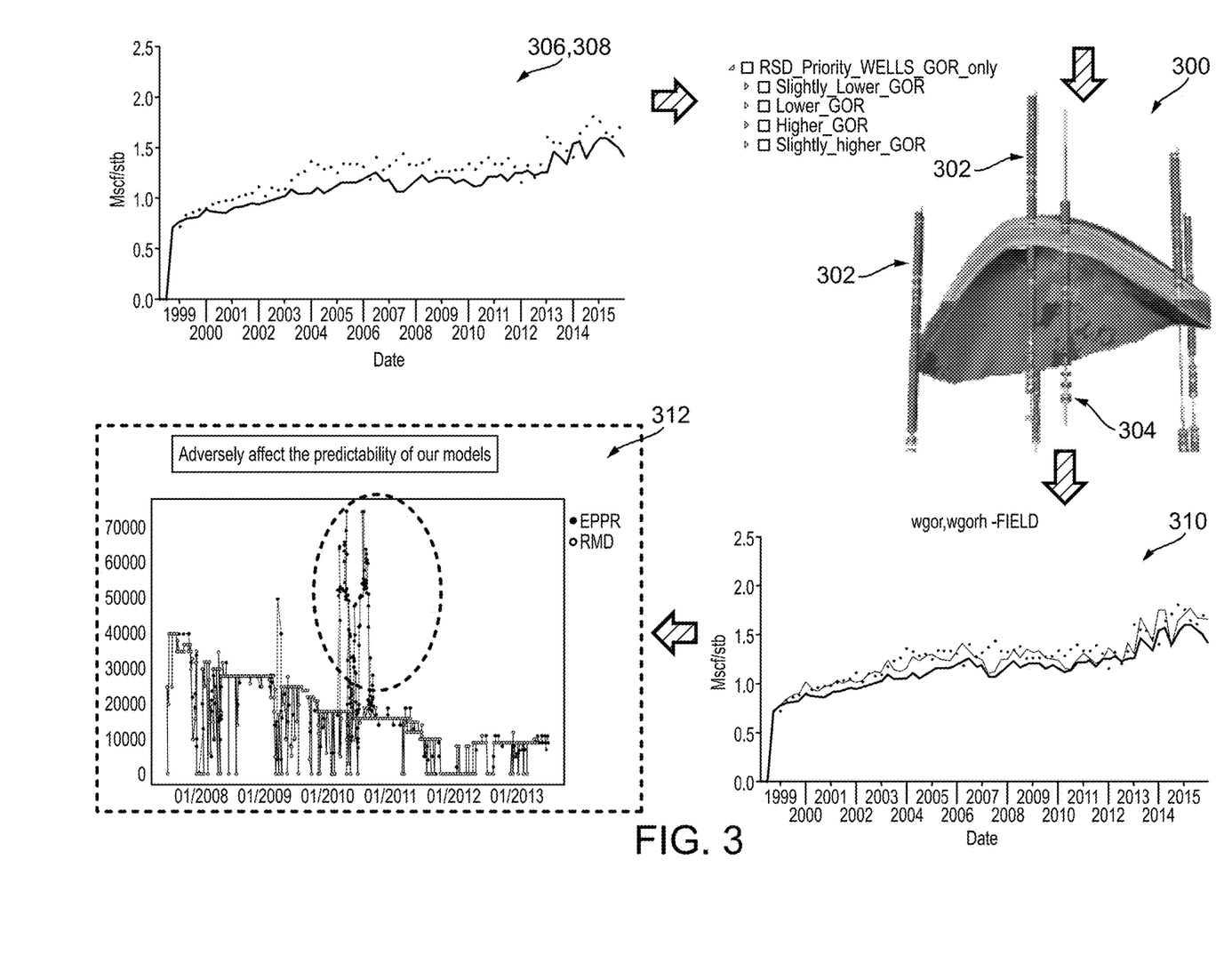
FIG. 3 illustrates a schematic view of an exemplary petroleum reservoir incorporating wells and sensors used by the present disclosure, as well as representative data output by the sensors.

FIG. 3 shows an exemplary petroleum reservoir 300 incorporating multiple wellheads 302, wherein each wellhead comprises multiple permanent or removable downhole sensors 304, such as production logging tools, to measure reservoir historical production data 306. All reservoir historical production data 306 gathered by the sensors 304 are position-indexed and time-indexed over all intervals of data capture, which enables the data to be correlated in meaningful way by a system such as that described by the present disclosure.

From measured data when the well is fully open, the well produces the maximum and defines the upper limit of the production. At the lowest choke setting the well will produce the lowest and will define the lower limits of the production rates. The rates are then co-related to pressure, GOR, etc. and the boundary conditions are established. In this way an operational envelope for a well is generated. Once the operational window is defined, the model is trained with the upper and lower limits of the well, and any data that is outside the boundary limits is consider misallocated. In other words, if the rate is above the well's fully opened upper limit, the data is identified as misallocated and is sent back to the pool for reallocation. A back propagation algorithm using the trained model allocates the data to its specific well using the correlation it developed from different properties like pressure, saturation logs etc., as previously noted.

Figure 4:
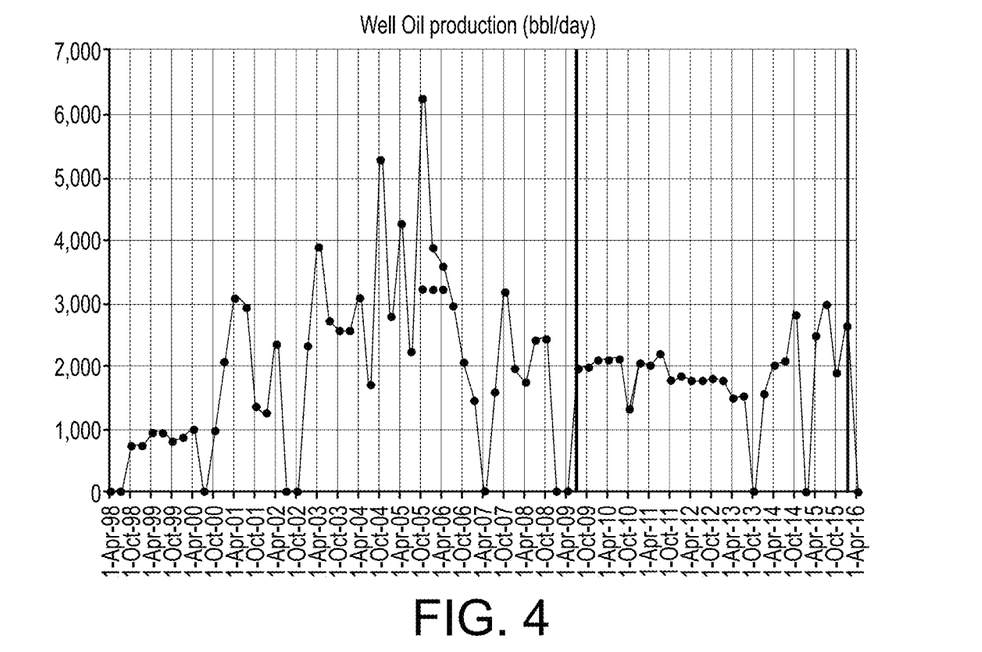
FIG. 4. shows an exemplary graph of reservoir historical production data with a "high-confidence" data interval from 2009 to 2016. The data has the status of "high confidence" data due to the fact that the measurements were made under known conditions with new instrumentation that was installed during this period.
Figure 5:
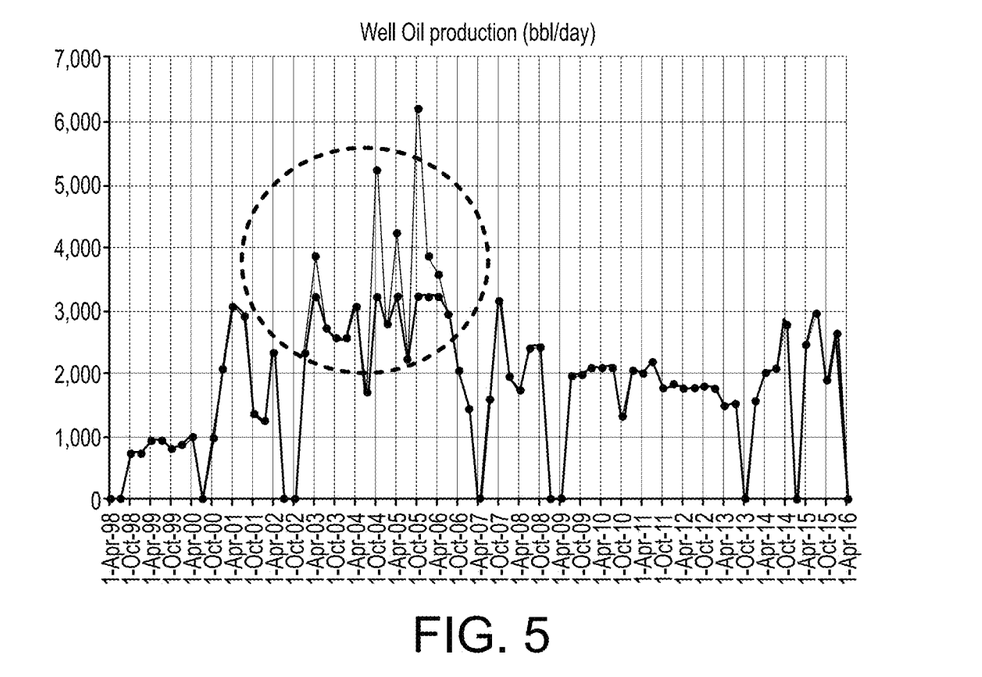
FIG. 5 shows the exemplary graph of FIG. 4 now annotated to show allocated data (within the broken line circle) which is outside of the operational window of the "high-confidence" data of the reservoir historical production data. The model was trained on known data to give it the capability to identify erroneous or misallocated data.

The reservoir historical production data 306 captured by the sensors 304 constitutes a reservoir training set 308 to be used to train a reservoir simulation. FIGS. 4 and 5 show an exemplary graph of reservoir sample data. FIG. 4 shows data an interval which, in accordance with the present disclosure, is classified as being a "high confidence" interval because conditions over the interval from 2009 to 2016 in this example were measured with highly sensitive instrumentation over an interval of time, and thus are known to be representative of typical operational conditions for the subject well. This is the dataset that is to be used to retrain a neural network 100 to improve a predictive ability of a reservoir simulation. On the other hand, the same data shown in FIG. 5 has portions of data that reside outside of the operational window of the well in question, as shown within the broken line circle, making that data unsuitable for use in training a reservoir simulation as it is unrepresentative of typical operational conditions. After the reservoir simulation has been trained, downhole sensors 304 can provide high-confidence reservoir sample data 310 useful for comparisons 312 with the reservoir historical production data 306 that was used to train the reservoir simulation. In this manner, notable discrepancies possibly indicative of the presence of misallocated historical production data can be uncovered.

Figure 6:
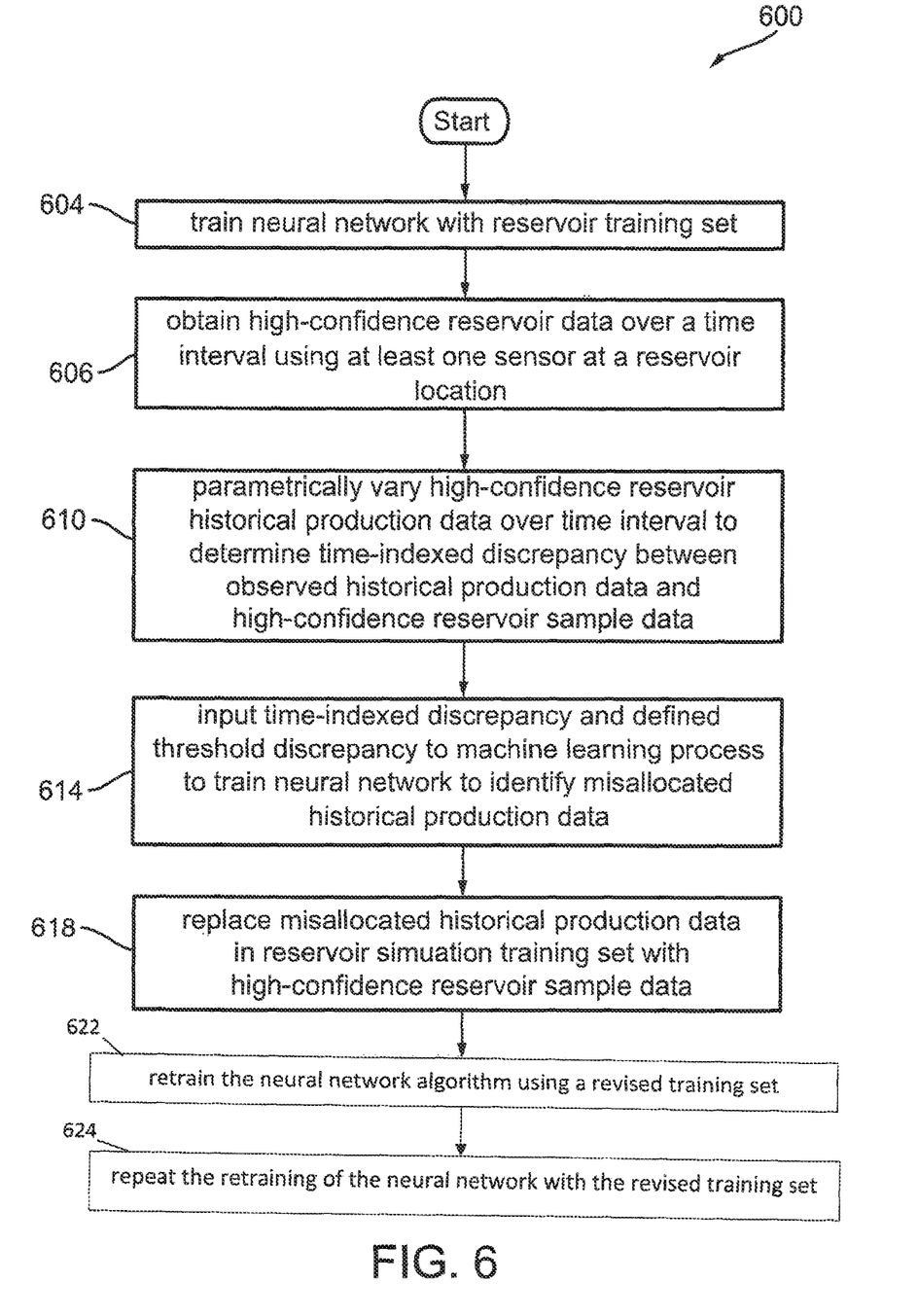
FIG. 6 illustrates a flow diagram of one method according to the present disclosure.
Figure 8:
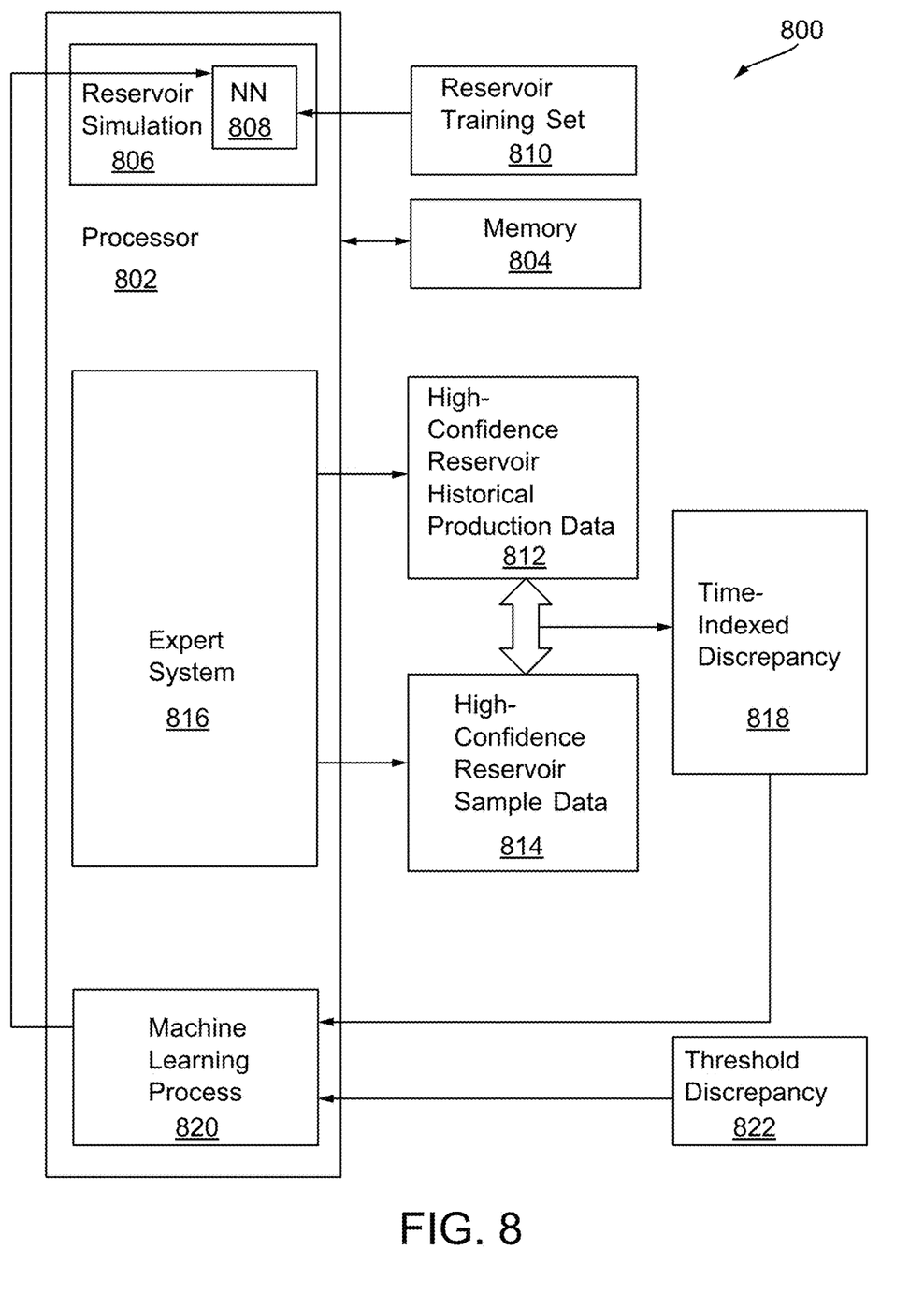
FIG. 8 illustrates a schematic view of one system according to the present disclosure.

FIG. 6 is a flow diagram illustrating a method 600 in accordance with the present disclosure, wherein a reservoir simulation 806, shown in FIG. 8, is trained to make predictions of reservoir performance. The method 600 begins with training step 604, implemented by using the reservoir training set 308 to train a neural network 100 to function as a reservoir simulation 806 capable of making predictions of reservoir performance. Data comprising the reservoir training set 308 is provided as input to a neural network 100 such as that shown in FIG. 1. The neural network algorithm is implemented by one or more processors programmed by computer code. The neural network 100, operating as configured by the computer code, intelligently determines all position and time-based correlations between the various sensed reservoir parameters based upon the reservoir historical production data 306. The neural network 100 solves the multivariate problem of how changes in one flow parameter will affect all other flow parameters in the reservoir, allowing the reliable prediction of reservoir conditions when a set of initial and boundary conditions are provided as inputs. Furthermore, if changes are made to these initial or boundary conditions, whether on the order-of-magnitude scale or small perturbations on the supplied inputs, the trained neural network 100 of the disclosure's reservoir simulation 806 will respond with predictions that correctly show the effects of these changes as propagated through all corners of the simulated reservoir flow field. With the neural network so-trained with the reservoir historical production data 306, the reservoir simulation is now ready to be used to make predictions of reservoir performance.

Of course, any simulation constructed by training with a dataset of measured data is only as good a predictive tool as the data it was trained with. Therefore, any misallocated or erroneous data in the reservoir training set 308 that was used to train and develop correlations within the neural network 100 of the reservoir simulation 806 will skew the predictions made by the simulation away from correct values, perhaps dramatically so. For this reason, and in accordance with a salient aspect of the present disclosure, at step 606 the method 600 seeks to identify such misallocated or "outlier" data by using at least one of the sensors 304 at a reservoir location to provide high-confidence reservoir sample data 310 over a time interval. The method 600 includes, at step 610, parametrically varying the reservoir historical production data 306 over the time interval to determine a time-indexed discrepancy 312 between the reservoir historical production data 306 and the high-confidence reservoir sample data 310 which has been sensed over the time interval.

A system implementing the method of the present disclosure can utilize an expert system, implemented by a processor configured with code executing therein, to perform the parametric variation of the reservoir historical production data 306 described in step 610, although other computer-implemented solutions can be practiced as well. The expert system is programmed with a knowledge base, constituted of expected values for thermofluidic and geological data that would be typical of a comparable petroleum reservoir. The expert system also comprises an inference engine that includes the rules for operations on and relationships between the data, which in the case of the petroleum reservoir includes the governing equations for conservation of mass (continuity), conservation of momentum (Navier-Stokes equations), and conservation of energy. Other parameters and effects that are specific to petroleum reservoirs, such as the effects of well spacing and depth, gas/oil ratio (GOR), as well as porosity and permeability data, are also encoded in the expert system.

Having been encoded as a petroleum reservoir expert system, the system is configured by the code executing in the processor to parametrically vary the reservoir historical production data 306 across a time interval over which high-confidence reservoir sample data 310 has been captured, and, as it does so, compare the parametrically varied reservoir historical production data 306 data to high-confidence reservoir sample data 310 at corresponding positions in the reservoir, thereby compiling a time-indexed discrepancy in the process shown as step 610.

The next step 614 of the disclosed method requires the definition of a threshold discrepancy 822 beyond which a given instance of reservoir historical production data becomes classified as misallocated historical production data. Geologists and petroleum engineers will be well-qualified to make the determination as to the appropriate threshold discrepancy for making the determination of a likely instance of misallocated historical production data. Using the time-indexed discrepancy 312 and the threshold discrepancy 822 as inputs to a machine learning process, the neural network 100 is trained to identify reservoir historical production data 306 that should be classified as misallocated historical production data, wherein the discrepancy between that instance of reservoir historical production data 306 and the corresponding high-confidence reservoir sample data 310 exceeds the threshold discrepancy 822. In an implementation of the present disclosure, the machine learning process comprises a neural network algorithm trained with high confidence data which is then presented with low confidence historical data wherein conditions were less reliably measured and less comprehensively documented.

As will be understood, step 614 can, in an alternative implementation consistent with the present disclosure, process the data and classify reservoir historical production data as not being misallocated on the basis of thresholds which test for being within a range. In such an implementation, data within the range is retained for the training the simulation, and thus results in a data set comparable to the determination of threshold discrepancies 822 as described above.

Continuing the discussion of FIG. 6, at step 618, the identified misallocated historical production data is replaced in the reservoir training set 308 with the high-confidence reservoir sample data to produce a revised training set. Thus, the reservoir training set defined in accordance with the technical solution described herein is now closer to a true representation of actual performance characteristics of the petroleum reservoir. This provides a benefit in that the revised training set provides the means to increase the accuracy of the reservoir simulation 806.

Step 622 of the disclosed method uses the revised training set to retrain the neural network algorithm to produce correlations in a conventional manner as other neural networks are trained.

At step 624, the process flow repeats the retraining of the neural network with the revised training set. This produces revised correlations in support of improved predictions of reservoir performance by the reservoir simulation. Step 624 can be repeated any number of times until the simulation's predictions show a desired fidelity to the measurements being obtained from the reservoir sensors.

Figure 7:
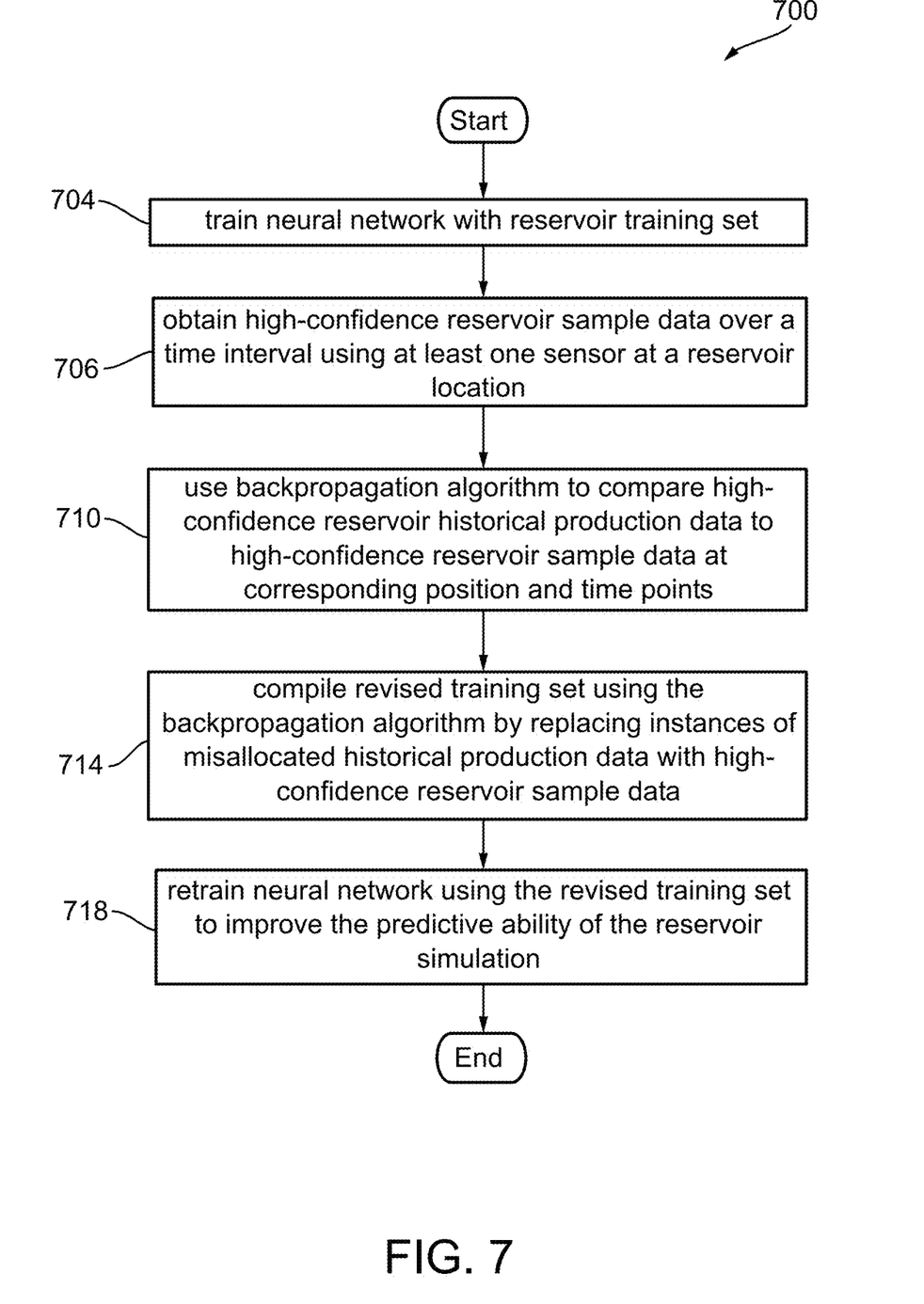
FIG. 7 illustrates a flow diagram of another method according to the present disclosure

FIG. 7 is a flow diagram illustrating another method 700 in accordance with the present disclosure, wherein a reservoir simulation is trained using reservoir historical production data and high-confidence reservoir sample data to identify and replace misallocated historical production data with high-confidence reservoir sample data, thereby improving a predictive ability of the reservoir simulation. After training the neural network with the reservoir training set in step 704 and obtaining high-confidence reservoir sample data over a time interval using at least one sensor at a reservoir location in step 706, a backpropagation algorithm is then used in step 710 to compare reservoir historical production data to high-confidence reservoir sample data at corresponding position and time points. A revised training set is compiled in step 714 using the backpropagation algorithm by replacing instances of reservoir historical production data with high-confidence reservoir sample data at corresponding position and time points at which differences between the two datasets, indicating misallocated historical production data, have been identified by the comparison. In step 718, the neural network algorithm is retrained using the revised training set to improve the predictive ability of the reservoir simulation.

Consistent with the disclosure, the reservoir historical production data and the high-confidence reservoir sample data can include, without limitation, observed production data, well logs, saturation logs, permeability logs, porosity logs, the product of formation permeability k and producing formation thickness h (kh), reservoir contact length, well spacing, choke opening, well location, well depth, well test data, well trajectories, well workover data, buildup test data, production logging tool data, repeat formation tester (RFT) data, pressure-volume-temperature (PVT) data, gas/oil ratio (GOR) data, core data, special core analysis laboratory (SCAL) data, gas oil separation plant (GOSP) level, well level, well rate tests, separator tests, portable tests, and productivity/injectivity index.

FIG. 8 shows a system implementation of an embodiment 800 of the present disclosure. The computer-based system is comprised of at least one processor 802 that is connected to at least one memory 804. The at least one processor 802 is host to a reservoir simulation 806 comprising code executing (i.e., running) on the processor. At the core of the reservoir simulation 806 is a neural network 808, also comprising code executing in the processor, wherein the neural network is trained with a dataset referred to as a reservoir training set 810. The data set is comprised of reservoir physical conditions that have been obtained from the reservoir historical production data 812, and is stored in a memory, such as memory 804.

During reservoir operation, at least one sensor such as the production logging tool (PLT) shown in FIGS. 2A and 2B can be used at a reservoir location to obtain high-confidence reservoir sample data 814 over a time interval for use in comparisons to the reservoir historical production data 812 that was used to train the neural network 808 of the reservoir simulation. Such data is stored in non-transient memory, such as the memory 804.

In an implementation of the present disclosure, an expert system 816 can be used to make the comparisons. The expert system 816 runs on the at least one processor 802 and is programmed with a knowledge base, constituted of expected values for thermofluidic and geological data that would be typical of a comparable petroleum reservoir. The expert system 816 also comprises an inference engine that includes the rules for operations on and relationships between the data, which in the case of the petroleum reservoir includes the governing equations for conservation of mass (continuity), conservation of momentum (Navier-Stokes equations), and conservation of energy. Other parameters and effects that are specific to petroleum reservoirs, such as the effects of well spacing and depth, gas/oil ratio (GOR), as well as porosity and permeability data, are also encoded in the expert system. Having been encoded as a petroleum reservoir expert system, the system can then parametrically vary the reservoir historical production data 812 across a time interval over which high-confidence reservoir sample data 814 has been captured, and as it does so compare the parametrically varied reservoir historical production data 812 to high-confidence reservoir sample data 814 at corresponding positions in the reservoir while compiling a time-indexed discrepancy 818 in the process.

In an implementation of the present disclosure, a machine learning process 820 running on the at least one processor 802 is configured to perform further training of the reservoir simulation's neural network 808.

The problem of misallocated historical production data is one that is one with which geologists, production engineers and petroleum engineers are well familiar. These petroleum professionals know the degree of discrepancy between measured production parameters and the expected parameters, based upon historical data, that would indicate a potential problem with misallocated historical production data. This knowledge acquired through experience with petroleum reservoir operations enables responsible petroleum professionals to define a threshold discrepancy 822 that, when exceeded, leads to a classification of an instance of reservoir historical production data 812 as misallocated historical production data.

The machine learning process 820 uses the time-indexed discrepancy 818 and the defined threshold discrepancy 822 as inputs to further train the neural network 808, enabling it to develop the ability to identify reservoir historical production data 812 whose discrepancy exceeds the threshold discrepancy 822, leading said data to be classified as misallocated historical production data. In an implementation of the present disclosure, the machine learning process 820 comprises a neural network.

The machine learning process 820 is further configured to replace the identified misallocated historical production data in the reservoir simulation training set with the high-confidence reservoir sample data to produce a revised training set. This replacement of data used in the training set brings the reservoir training set closer to a true representation of actual performance characteristics of the petroleum reservoir, which is beneficial in that the revised training set provides the means to increase the accuracy of the reservoir simulation 806. The neural network algorithm 808 is configured to be retrained to produce correlations by using the revised training set to retrain the neural network 808. The retraining of the neural network 808 with the revised training set can be repeated, which produces revised correlations in support of improved predictions of reservoir performance by the reservoir simulation 806. The retraining of neural network 808 can be repeated any number of times until the simulation's predictions show a desired fidelity to the measurements being obtained from the reservoir sensors.

Figure 9:
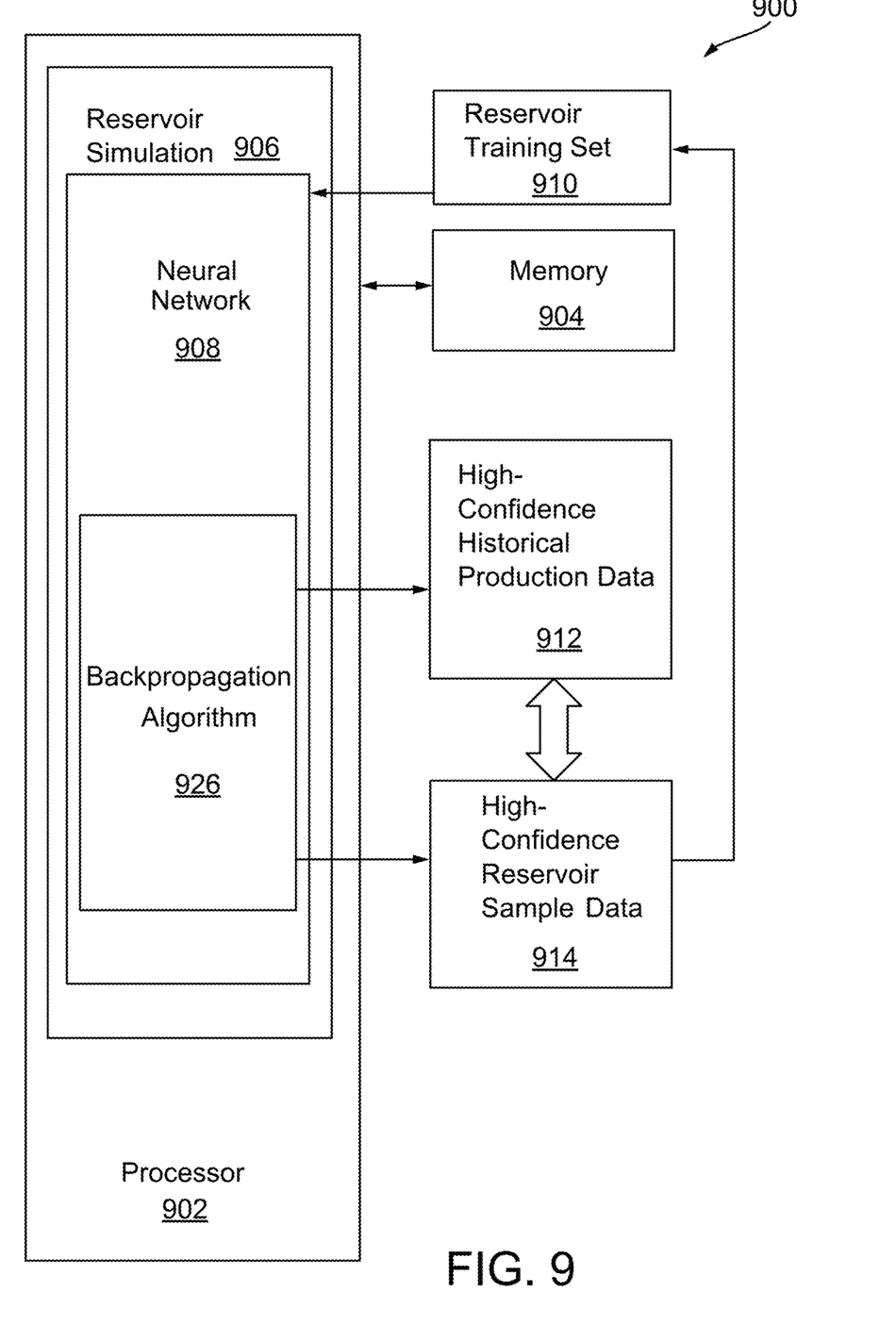
FIG. 9 illustrates a schematic view of another system according to the present disclosure.

FIG. 9 illustrates another system 900 in accordance with the present disclosure. The system 900 incorporates a processor 902 and a memory 904. The processor 902 includes a reservoir simulation 906 having a neural network 908 trained using reservoir historical production data as a reservoir training set 910. The neural network 908 further comprises a backpropagation algorithm 926 configured to compare high-confidence historical production data 912 to high-confidence reservoir sample data 914 from the reservoir sensors at corresponding position and time points. The backpropagation algorithm 926 is also configured to compile a revised training set by replacing instances of reservoir historical production data with high-confidence reservoir sample data at corresponding position and time points at which differences between the two datasets, indicating misallocated historical production data, have been identified by the comparison. Finally, the backpropagation algorithm 926 is configured to retrain the neural network 908 using the revised reservoir training set to improve the predictive ability of the reservoir simulation.

As noted above, consistent with the disclosure, the reservoir historical production data and the high-confidence reservoir sample data can include, without limitation, observed production data, well logs, saturation logs, permeability logs, porosity logs, the product of formation permeability k and producing formation thickness h (kh), reservoir contact length, well spacing, choke opening, well location, well depth, well test data, well trajectories, well workover data, buildup test data, production logging tool data, repeat formation tester (RFT) data, pressure-volume-temperature (PVT) data, gas/oil ratio (GOR) data, core data, special core analysis laboratory (SCAL) data, gas oil separation plant (GOSP) level, well level, well rate tests, separator tests, portable tests, and productivity/injectivity index.

From the foregoing, it will be understood that initial condition and boundary limits are derived by the algorithm from the observed data which are actual measurements made either in the lab or in the field. The data is co-related in form of an operational window for a well which is derived from all measurement like geology, separate tests, lab test, logs, reservoir properties, production rates, bottom hole pressures, etc. This derived operational window is then tested with actual, known data which was not used in the initial training of the model and in this way the trained model is validated. After model validation, all production allocation data is subjected to the foregoing chosen algorithm and any bad allocated data outside of the limits is identified (FIG. 5) and sent back to the pool as "bad" allocated data. The pool production data then uses the back-propagation algorithm in view of the operational window, open/shut status of the wells, and the trained algorithm in order to allocate the data to the appropriate wells. For example, a water status (as opposed to an oil-producing status) will be assigned to a well where saturation log shows high water saturation and not assigned to the well in the converse case of low water saturation. Similarly, the gas volume from the pool is back-allocated to wells which are close to the gas oil contact and when the operational window indicates high GOR.

More particularly, in regard to the water status of a well, the saturation logs capture information concerning where in the field there is water saturation, that is a "high" water level. When there is water unallocated in the pool, in accordance with the disclosure, it can be assigned to the well or wells where the saturation logs shows high water. This back allocation for the water level constitutes a correction of the data to improve the predictive ability of the simulation, in accordance with the present disclosure. Likewise, whether the back-allocation is for any of the production data, any of the logs (saturation logs, well logs, permeability logs, porosity logs), or any number of geological or geophysical data (e.g., the product of formation permeability k and producing formation thickness h (kh), reservoir contact length, well spacing, choke opening, well location, well depth, well test data, well trajectories, well workover data, buildup test data, production logging tool data, repeat formation tester (RFT) data, pressure-volume-temperature (PVT) data, gas/oil ratio (GOR) data, core data, special core analysis laboratory (SCAL) data, gas oil separation plant (GOSP) level, well level, well rate tests, separator tests, portable tests, and productivity/injectivity index), such measurements are utilized in accordance with the disclosure in the same manner to identify and replace misallocated historical production data and thereby improve a predictive ability of the reservoir simulation.

The invention encompassed by the present disclosure has been described with reference to the accompanying drawings, which form a part hereof, and which show, by way of illustration, example implementations and/or embodiments. As such, the figures and examples above are not meant to limit the scope of the present application to a single implementation, as other implementations are possible by way of interchange of some or all of the described or illustrated elements, without departing from the spirit of the present disclosure. Among other things, for example, the disclosed subject matter can be embodied as methods, devices, components, or systems.

Moreover, where certain elements of the present application can be partially or fully implemented using known components, only those portions of such known components that are necessary for an understanding of the present application are described, and detailed descriptions of other portions of such known components are omitted so as not to obscure the application. In the present specification, an implementation showing a singular component should not necessarily be limited to other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present application encompasses present and future known equivalents to the known components referred to herein by way of illustration.

Furthermore, it is recognized that terms used herein can have nuanced meanings that are suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter can be based upon combinations of individual example embodiments, or combinations of parts of individual example embodiments.

The foregoing description of the specific implementations will so fully reveal the general nature of the application that others can, by applying knowledge within the skill of the relevant art(s) (including the contents of the documents cited and incorporated by reference herein), readily modify and/or adapt for various applications such specific implementations, without undue experimentation, without departing from the general concept of the present application. Such adaptations and modifications are therefore intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the relevant art(s). It is to be understood that dimensions discussed or shown of drawings are shown accordingly to one example and other dimensions can be used without departing from the present disclosure.

While various implementations of the present application have been described above, it should be understood that they have been presented by way of example, and not limitation. It would be apparent to one skilled in the relevant art(s) that various changes in form and detail could be made therein without departing from the spirit and scope of the disclosure. Thus, the present disclosure should not be limited by any of the above-described example implementations, and the invention is to be understood as being defined by the recitations in the claims which follow and structural and functional equivalents of the features and steps in those recitations.

What is claimed:

1. A computer-based method of training a reservoir simulation using reservoir historical production data and high-confidence reservoir sample data to identify misallocated historical production data and thereby improve a predictive ability of the reservoir simulation, the method comprising:
   training a neural network algorithm with a reservoir training set to produce correlations that enable the reservoir simulation to make predictions of reservoir performance, wherein the reservoir training set comprises reservoir physical conditions obtained from the reservoir historical production data;
   obtaining high-confidence reservoir sample data which is sensed over a time interval using at least one portable sensor or at least one sensor at a reservoir location;
   parametrically varying the reservoir historical production data over the time interval to determine a time-indexed discrepancy between the reservoir historical production data and the high-confidence reservoir sample data which has been sensed over the time interval at corresponding locations in a reservoir;
   using the time-indexed discrepancy and a defined threshold discrepancy as inputs to a machine learning process to further train the neural network algorithm to identify reservoir historical production data whose discrepancy exceeds the threshold discrepancy and thereby constitutes misallocated historical production data;
   replacing the identified misallocated historical production data in the reservoir training set with the high-confidence reservoir sample data to produce a revised training set;
   training a machine with known measurements of high confidence;
   establishing an operational window for a well;
   subjecting a model to a whole life of the well historical data; and
   identifying any data which fall out of the operational limits of the well as misallocated data.

2. The method as in claim 1, further comprising retraining the neural network algorithm to produce correlations using the revised training set as input to the neural network algorithm.

3. The method as in claim 2, wherein the step of training the neural network algorithm of claim 1 is repeated with the revised training set, producing revised correlations in support of improved predictions of reservoir performance by the reservoir simulation.

4. The method as in claim 1, wherein the machine learning process comprises the neural network algorithm.

5. A computer-based system used to train a reservoir simulation using high-confidence reservoir historical production data and high-confidence reservoir sample data to identify misallocated historical production data for improvement of a predictive ability of the reservoir simulation, the system comprising:
   at least one processor connected to at least one memory;
   a reservoir simulation running on the at least one processor, the reservoir simulation comprising a neural network algorithm trained with a reservoir training set to produce correlations that enable the reservoir simulation to make predictions of reservoir performance, wherein the reservoir training set comprises reservoir physical conditions obtained from the high-confidence reservoir historical production data;

at least one portable sensor or at least one sensor at a reservoir location to provide high-confidence reservoir sample data over a time interval;

an expert system running on the at least one processor, the expert system configured to parametrically vary the reservoir historical production data over the time interval to determine a time-indexed discrepancy between the reservoir historical production data and the high-confidence reservoir sample data which has been sensed over the time interval at corresponding locations in a reservoir;

a machine learning process running on the at least one processor, the machine learning process configured to use the time-indexed discrepancy and a defined threshold discrepancy as inputs to further train the neural network algorithm to identify reservoir historical production data whose discrepancy exceeds the threshold discrepancy and thereby constitutes misallocated historical production data, the machine learning process further configured to replace the identified misallocated historical production data in the reservoir simulation training set with the high-confidence reservoir sample data to produce a revised training set.

6. The system as in claim 5, wherein the neural network algorithm is configured to be retrained to produce correlations by using the revised training set as input to the neural network algorithm.

7. The system as in claim 6, wherein the step of training the neural network algorithm of claim 5 is repeated with the revised training set, producing revised correlations in support of improved predictions of reservoir performance by the reservoir simulation.

8. The system as in claim 5, wherein the machine learning process comprises the neural network algorithm.

9. A computer-based method of training a reservoir simulation using reservoir historical production data and high-confidence reservoir sample data to identify and replace misallocated historical production data with high-confidence reservoir sample data, thereby improving a predictive ability of the reservoir simulation, the method comprising:

using high-confidence reservoir historical production data as a training set to train a neural network algorithm to function as a reservoir simulation capable of predicting values for reservoir production data, wherein the reservoir historical production data has been obtained over an interval of time from a plurality of sensors distributed throughout a reservoir;

obtaining high-confidence reservoir sample data using at least one portable sensor or at least one of the plurality of sensors distributed throughout the reservoir; and using a backpropagation algorithm to:
compare reservoir historical production data to high-confidence reservoir sample data at corresponding position and time points;

compile a revised training set by replacing instances of reservoir historical production data with high-confidence reservoir sample data at corresponding position and time points at which differences between the reservoir historical production data and the high-confidence reservoir sample data, indicating misallocated historical production data, have been identified by the comparison; and retrain the neural network algorithm using the revised training set to improve the predictive ability of the reservoir simulation.

10. The method as in claim 9, wherein the reservoir historical production data and the high-confidence reservoir sample data comprise: observed production data, well logs, saturation logs, permeability logs, porosity logs, saturation logs, a product of formation permeability k and producing formation thickness h (kh), reservoir contact length, well spacing, choke opening, well location, well depth, well test data, well trajectories, well workover data, buildup test data, production logging tool data, repeat formation tester (RFT) data, pressure-volume-temperature (PVT) data, gas/oil ratio (GOR) data, core data, special core analysis laboratory (SCAL) data, gas oil separation plant (GOSP) level, well level, well rate tests, separator tests, portable tests, and productivity/injectivity index.

11. A computer-based system used to train a reservoir simulation using reservoir historical production data and high-confidence reservoir sample data to identify misallocated historical production data and replace misallocated historical production data with high-confidence reservoir sample data, thereby improving a predictive ability of the reservoir simulation, the system comprising:

a plurality of sensors distributed throughout a reservoir to obtain reservoir historical production data over an interval of time;

at least one processor connected to at least one memory;

a reservoir simulation running on the at least one processor, the reservoir simulation comprising:
a neural network algorithm trained with a reservoir training set comprising the reservoir historical production data to enable the neural network algorithm to function as a reservoir simulation capable of predicting values for reservoir production data, wherein the neural network algorithm further comprises a backpropagation algorithm configured to:
compare reservoir historical production data to high-confidence reservoir sample data at corresponding position and time points, the high-confidence reservoir sample data obtained using at least one portable sensor or at least one of the plurality of sensors distributed throughout the reservoir;

compile a revised training set by replacing instances of reservoir historical production data with high-confidence reservoir sample data at corresponding position and time points at which differences between the reservoir historical production data and the high-confidence reservoir sample data, indicating misallocated historical production data, have been identified by the comparison;

retrain the neural network algorithm using the revised reservoir training set to improve the predictive ability of the reservoir simulation;

send the misallocated data back to a pool of misallocated data;

use the back propagation algorithm assigned to a well which has the potential of producing results; and if a saturation log does not show water but the well shows produced water, then the back propagation algorithm tracks the produced water to the well whose saturation log with time indicates possible water breakthroughs.

12. The system as in claim 11, wherein the reservoir historical production data and the high-confidence reservoir sample data comprise: observed production data, well logs, saturation logs, permeability logs, porosity logs, saturation logs, a product of formation permeability k and producing formation thickness h (kh), reservoir contact length, well spacing, choke opening, well location, well depth, well test data, well trajectories, well workover data, buildup test data, production logging tool data, repeat formation tester (RFT) data, pressure-volume-temperature (PVT) data, gas/oil ratio (GOR) data, core data, special core analysis laboratory (SCAL) data, gas oil separation plant (GOSP) level, well level, well rate tests, separator tests, portable tests, and productivity/injectivity index.

\* \* \* \* \*